(12) United States Patent
Yip

(10) Patent No.: US 7,701,741 B2
(45) Date of Patent: Apr. 20, 2010

(54) VERIFYING AN ERASE THRESHOLD IN A MEMORY DEVICE

(75) Inventor: Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 11/949,086

(22) Filed: Dec. 3, 2007

(65) Prior Publication Data

US 2009/0141559 A1    Jun. 4, 2009

(51) Int. Cl.
 *G11C 16/06* (2006.01)
(52) U.S. Cl. .............. 365/22; 365/189.09; 365/185.11; 365/185.29
(58) Field of Classification Search .............. 365/22, 365/189.09, 185.11, 185.29
See application file for complete search history.

(56) References Cited

U.S. PATENT DOCUMENTS

| 6,452,840 | B1 * | 9/2002 | Sunkavalli et al. | ....... 365/185.3 |
| 7,411,824 | B2 * | 8/2008 | Shibata et al. | ......... 365/185.11 |
| 2007/0014152 | A1 * | 1/2007 | Shibata et al. | ......... 365/185.11 |
| 2007/0140015 | A1 * | 6/2007 | Kawamura | ............. 365/185.22 |

* cited by examiner

*Primary Examiner*—Thong Q Le
(74) *Attorney, Agent, or Firm*—Leffert Jay & Polglaze, P.A.

(57) ABSTRACT

In one or more embodiments, a memory device is disclosed as having an erase verify operation that includes a negative bias on the p-well in which the memory cell or cells being erased are formed. After an erase pulse is applied to the selected cells to be erased, the p-well is biased with the negative voltage and the erase verify operation is performed to determine the erased state of the cell(s).

17 Claims, 5 Drawing Sheets

VERIFYING AN ERASE THRESHOLD IN A MEMORY DEVICE

TECHNICAL FIELD OF THE INVENTION

The present disclosure relates generally to semiconductor memory and more particularly to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile/flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Each cell in a non-volatile memory device can be programmed/erased so that it is in one of two states. For example, conventionally, cells are programmed/erased as a single bit per cell (e.g., as in the case with a single level cell—SLC) or multiple bits per cell (e.g., as in the case with a multilevel cell—MLC). Each cell's threshold voltage ($V_{th}$) determines the data that is stored in the cell. For example, in an SLC, a $V_t$ of 0.5V might indicate a programmed cell while a $V_t$ of −0.5V might indicate an erased cell.

Once a memory cell goes through an erase operation, it is erase verified. The purpose of the erase verify operation is to determine that the cell's $V_t$ is below a maximum voltage level (e.g., −1V). The most straightforward method for performing an erase verify is to apply an erase verify voltage as $V_{w1}$ to the memory cell control gate (e.g., via a select line, such as a word line). If the $V_t$ is less than or equal to $V_{w1}$, the cell conducts. If $V_t$ is greater than $V_{w1}$, the cell does not conduct.

The current causes the bit line voltage to decay and a sense amplifier detects the voltage decay. The rate of voltage decay detected by the sense amplifier determines whether or not the cell's $V_t$ is above or below the erase maximum threshold.

Due to the limitations of the integrated circuit technology, it is difficult to generate a negative voltage for $V_{w1}$ in an inexpensive manner. Therefore, this type of erase verify operation is difficult and expensive to perform and is unlikely to be performed in flash memory integrated circuits due to very small profit margins.

The difficulty of the above erase verify operation can be overcome by an inverted read in which the voltage of the bit lines and the source are inverted from that of the conventional read operation. In this type of verify, the saturated bit line voltage, which is a function of the cell's $V_t$, can be detected and the passing or failing determination can be made. However, this erase verify method experiences problems as well.

Ideally, the read and erase verify operations would employ the same timing and voltages so that memory cell operations can be simplified and uniform. But using an inverted read as the erase verify results in very different operations. The different timing of the erase verify and read operations is illustrated in FIG. 1.

The upper plot of FIG. 1 shows a timing diagram of a typical prior art erase verify operation that is also referred to as an "inverted" read. This plot shows that when the bit line is selected by the "SEL" select signal and the source is biased at $V_{CC}$, the bit line (BL) voltage is larger for the more erased memory cells.

The lower plot of FIG. 1 shows a typical prior art read operation timing. It is different from the erase verify operation in that the source line is biased at ground and, when the "SEL" signal selects the bit line, the bit line voltage is more negative for a more erased selected memory cell.

For the reasons stated above, and for other reasons stated below which will become apparent to those skilled in the art upon reading and understanding the present specification, there is a need in the art for an improved method for verifying an erased state of a memory cell.

DETAILED DESCRIPTION

Figure 1:
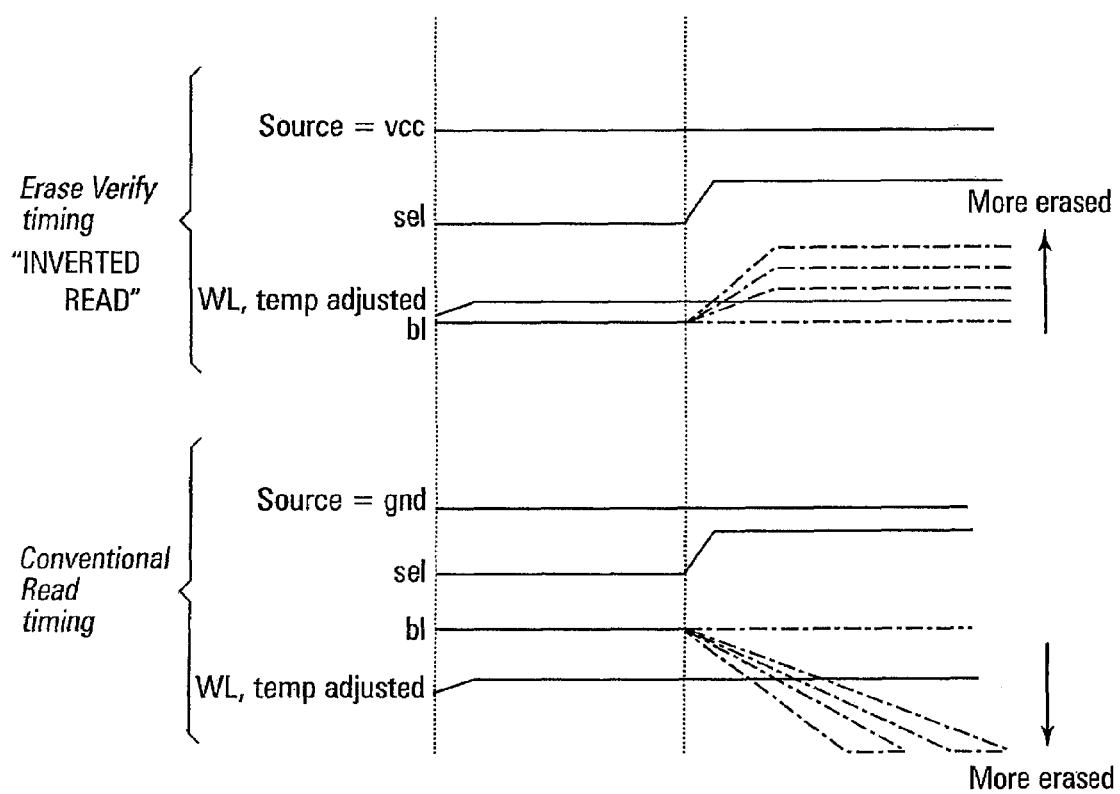
FIG. 1 shows a timing diagram of typical prior art erase verify and read operations.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
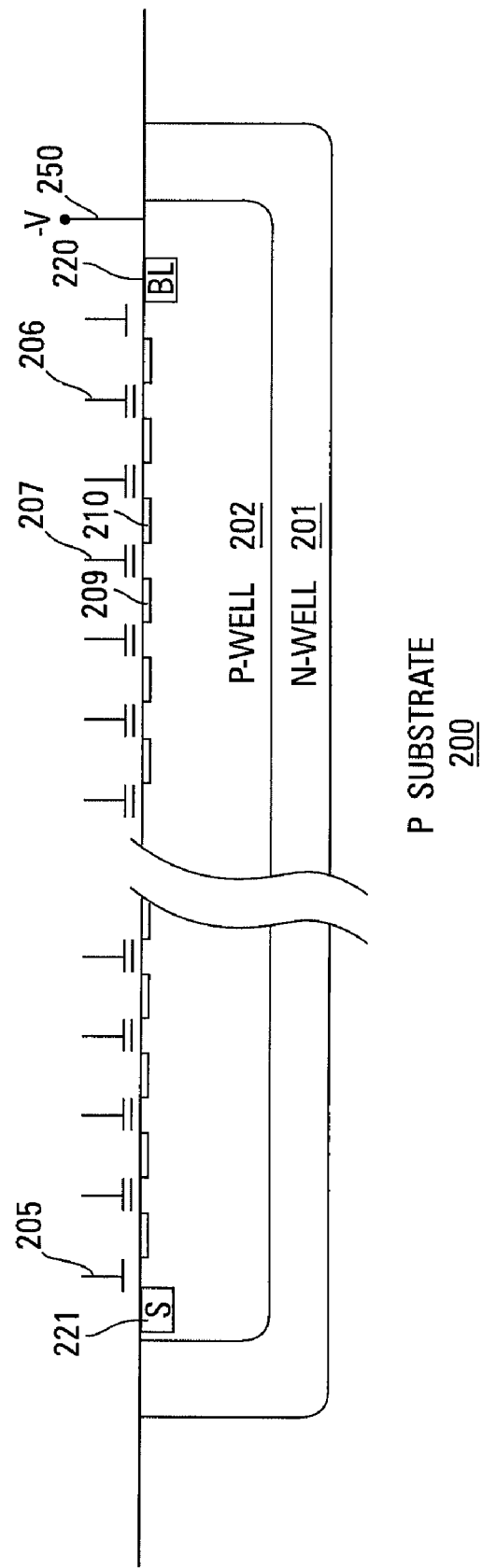
FIG. 2 shows a schematic diagram of one embodiment of a NAND memory cell series string.

FIG. 2 illustrates a schematic diagram of one embodiment of a series NAND string of memory cells. For purposes of clarity, only one series string of memory cells is illustrated. However, a typical memory array in a non-volatile memory device can be comprised of a large number of series strings of memory cells.

The series strings of memory cells are formed in a substrate 200 that can be comprised of silicon. The illustrated embodiment of FIG. 2 uses a p-type substrate. An alternate embodiment can use an n-type substrate.

Within the substrate 200, an n-well is formed 201 that contains a p-well 202. The n-well 201 isolates the p-well 202 from the remainder of the substrate 200. The memory array is formed within the p-well 202. The p-well is coupled to a negative voltage 250 during the erase verify operation as discussed subsequently.

Each NAND series string of memory cells is comprised of a select gate drain control transistor 206 and a select gate source control transistor 205 that are located on opposite ends of the series string. The select gate drain transistor 206 controls access of the series string to the bit line 220 for the column. The select gate source transistor 205 controls access of the series string to the source 221 of the memory block/memory array.

Each string is also comprised of the memory cells 207. In one embodiment, each string is comprised of 32 memory cells. Each cell includes a source region 209 and a drain region 210 that couples adjacent memory cells of the string to each other. Each memory cell 207 is also comprised of a charge storage node, such as a floating gate, that stores the charge for the cell. A control gate of the memory cell is coupled to a word line for each row of the memory block. The control gate controls the programming/erasing/reading of each cell in response to biasing of the word line coupled the selected cell.

Figure 3:
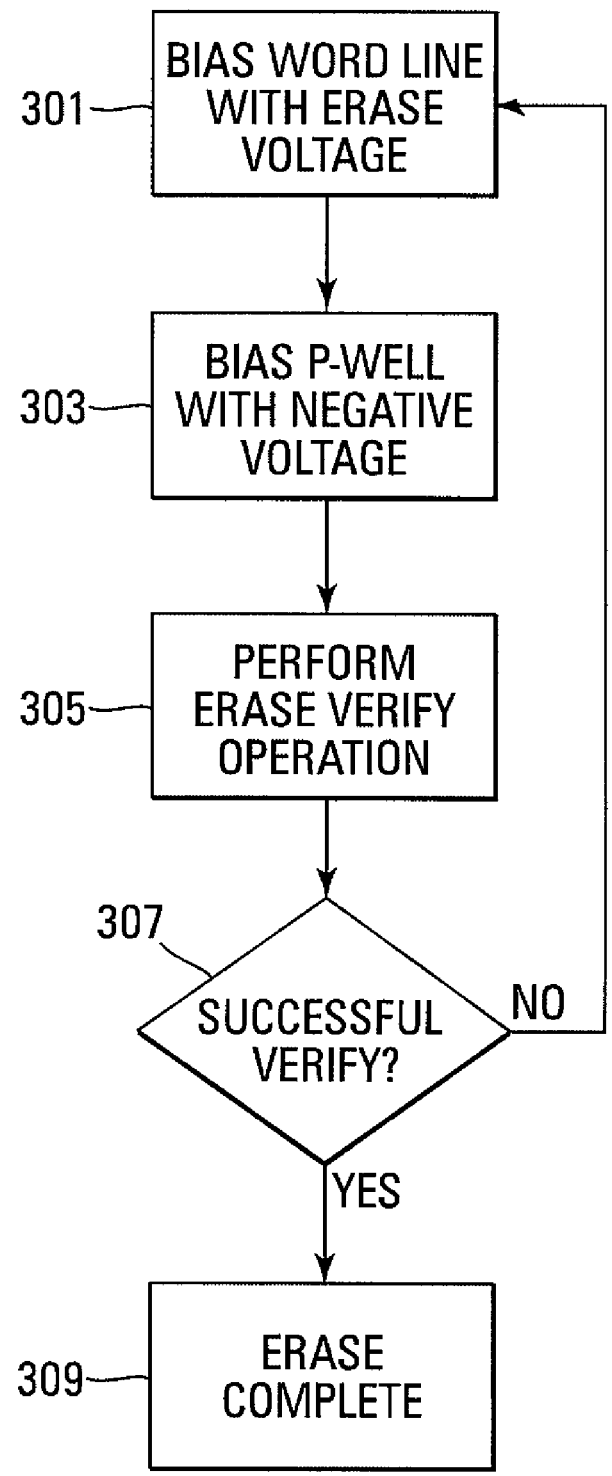
FIG. 3 shows a flowchart of one embodiment of a method for performing an erase operation that includes an erase verify.

FIG. 3 illustrates a flowchart of one embodiment of a method for performing an erase operation that includes an erase verify. Such an operation is typically performed on an entire memory block. However, the present embodiments are not limited to any predetermined quantity of memory cells.

When an erase operation is initiated, the word lines for the memory cells/block are biased with an erase voltage 301. This biases the control gates of each memory cell coupled to the biased word line with the erase voltage. In one embodiment, this erase voltage is approximately 0V. The drain and source connections of the bit lines that are coupled to the memory cells being erased are all left floating as are the select gate drain transistors and the select gate source transistors. Alternate embodiments can use other erase voltages.

The electric field that is oriented with the negative side from the floating gate and the positive side from the body or substrate should attract the electrons off of the floating gate, thus erasing the cell. Word lines of unselected blocks float so that coupling from the substrate charges up all of the unselected word lines to a higher value. The electric field across the floating gate and the substrate is not enough to erase the blocks.

Once the memory cells or entire memory block has experienced the erase pulse, the p-well is biased with a negative voltage (e.g., −5V) 303. This has the effect of shifting the Vt distribution of the memory cells in the positive direction. This shift is illustrated in FIG. 4.

Figure 4:
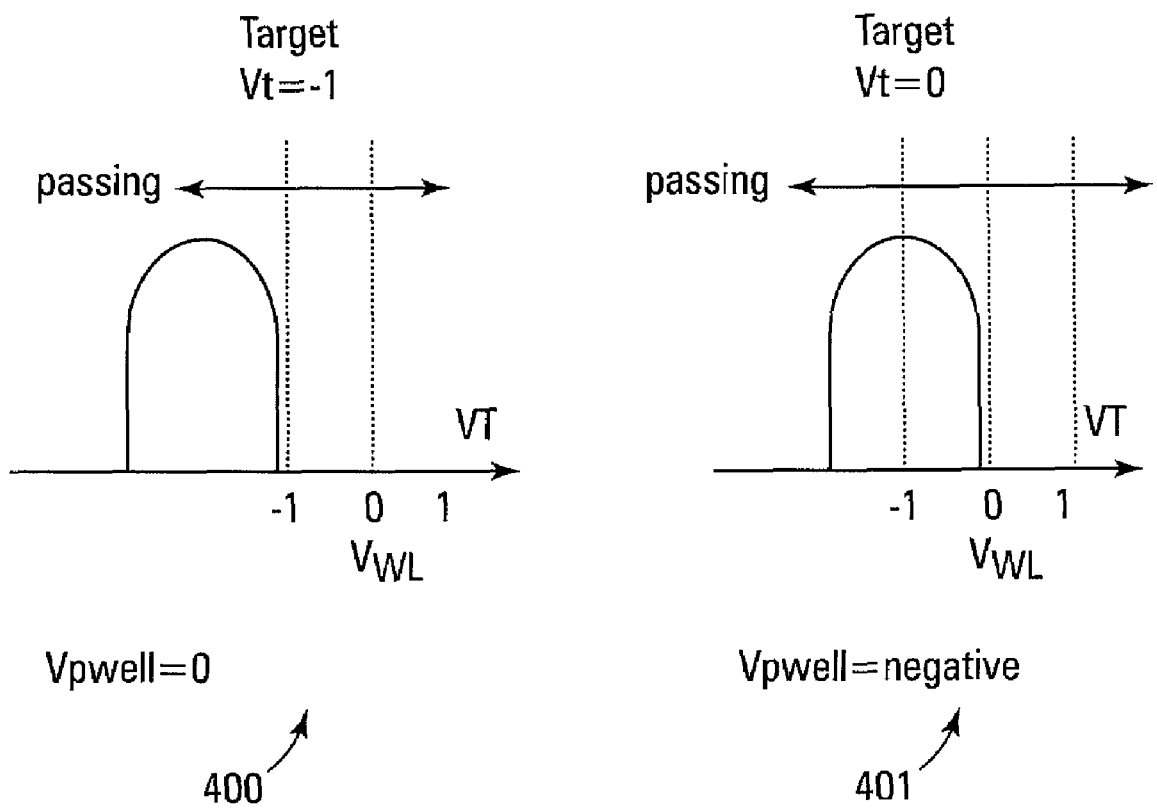
FIG. 4 shows one embodiment of the movement of a $V_t$ distribution for an erased state in accordance with the method of FIG. 2.

FIG. 4 illustrates a typical prior art erased distribution 400 in which the p-well is biased at 0V. In this scenario 400, the $V_t$ target for an erased cell is −1V so that any cell with a threshold voltage less than the target, passes the erase verify operation.

The erased distribution 401 on the right of FIG. 4 has been shifted in a positive direction, from the typical prior art position 400, by the negative p-well voltage. The target threshold voltage is now $V_t$=0V.

Referring again to the flowchart of FIG. 3, after the p-well is biased with the negative voltage 303, the erase verify operation is performed 305. The erase verify operation 305 comprises, at least in part, of biasing all of the word lines of the memory block (or the memory cells that just experienced the erase operation) with an erase verify voltage (e.g., 0V) while the selected bit lines are biased at another voltage (e.g., $V_{CC}$). A disable pulse at a certain level (e.g., 0V) is applied to the unselected bit lines. The select gate drain and source transistors are typically at 4.5V that is typically referred to in the art as $V_{pass}$. The erase current generated by each cell being erased is compared to a sense amplifier reference current level ($IS_{ref}$) (e.g., 30 μA) The erase verify operation can now have the same timing as a normal memory read operation. The verify operation of the present embodiments should also be faster than a typical inverted read operation discussed previously since it is not necessary to wait for the bit line voltage to saturate.

An additional benefit provided by this embodiment is that the back bias (i.e., the voltage drop from the memory block source line to the substrate area in which the selected memory cell resides) is substantially equivalent for the whole series NAND string or memory block. In a typical prior art memory string, the back bias voltage would increase as the distance along the series string increases from the source line.

If the memory cell or cells are successfully verified 307, the erase operation is complete 309. If the cell is not verified as erased 307, the memory cell or cells experience another erase operation as just described until the erase is successfully verified or an error condition occurs.

Figure 5:
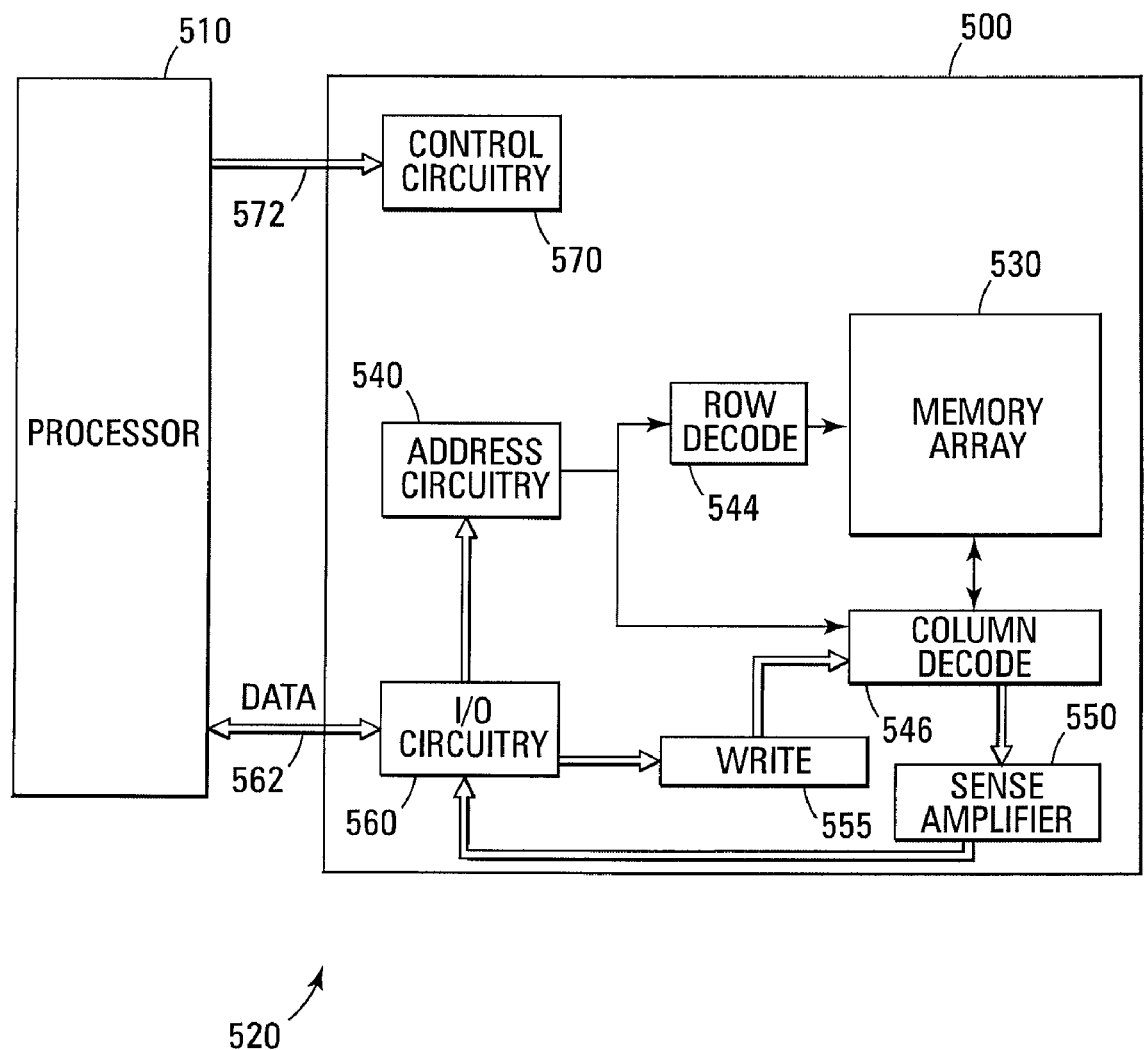
FIG. 5 shows a block diagram of one embodiment of a memory system incorporating the method for program window adjustment of the present disclosure.

FIG. 5 illustrates a functional block diagram of a memory device 500 that can incorporate the memory cells of the present invention. The memory device 500 is coupled to a processor 510. The processor 510 may be memory controller, a microprocessor or some other type of controlling circuitry. The memory device 500 and the processor 510 form part of a memory system 520. The memory device 500 has been simplified to focus on features of the memory that are helpful in understanding the present invention.

The memory device includes an array of non-volatile memory cells 530 that can be flash memory cells or other types of non-volatile semiconductor cells. The memory array 530 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture, as described previously, as well as other architectures.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense amplifier/buffer circuitry 550. The sense amplifier/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller. The control circuitry 570 is adapted to perform the erase verify embodiments disclosed previously. The control circuitry 570 can be part of the memory device 500 as shown or separate from the memory device 500.

The flash memory device illustrated in FIG. 5 has been simplified to facilitate a basic understanding of the features of the memory and is for purposes of illustration only. A more detailed understanding of internal circuitry and functions of flash memories are known to those skilled in the art. While the block diagram of FIG. 5 shows the control circuitry as being part of the memory device integrated circuit 500, alternate embodiments might have a memory array that is separate from the control circuitry.

CONCLUSION

In summary, one or more embodiments of the present disclosure provide an erase verification operation with the same timing as a normal memory read operation while also making the back bias for the memory block substantially the same throughout the block. These benefits are accomplished by biasing, with a negative voltage, the bulk that contains the memory cells being verified. In one embodiment, each memory block is formed in a different p-well in the substrate.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erase verifying a memory cell, the method comprising:
    biasing a bulk, in which the memory cell is located, with a negative voltage;
    biasing a control gate of the memory cell with an erase verify voltage;
    biasing, at $V_{CC}$, a selected bit line coupled to the memory cell;
    biasing unselected bit lines with a disable voltage; and
    comparing an erase current of the memory cell, resulting from the erase verify voltage, with a reference current to determine a state of the memory cell, wherein the erase current is generated at least partially in response to biasing the control gate of the memory cell with the erase verify voltage.

2. The method of claim 1 wherein the negative voltage is −5V and the bulk is a p-well.

3. The method of claim 1 wherein comparing comprises a sense amplifier comparing the erase current with the reference current.

4. A method for erase verifying a block of memory cells, the method comprising:
    biasing each word line of the block of memory cells with an erase voltage;
    biasing a p-well, comprising the block of memory cells, with a negative voltage;
    biasing each word line of the block of memory cells with a verify voltage;
    biasing selected bit lines of the block of memory cells with an enable voltage;
    biasing unselected bit lines of the block of memory cells with a disable voltage; and
    comparing erase current from the block of memory cells with a reference current to determine an erased state of the block of memory cells.

5. The method of claim 4 wherein the block of memory cells all experience a substantially equivalent back bias voltage.

6. The method of claim 4 and further including, after comparing, biasing each word line of the block of memory cells with the erase voltage if the erased state of the block of memory cells indicates an unerased memory cell.

7. The method of claim 4 wherein the negative voltage moves an erased threshold voltage distribution for the block of memory cells in a positive direction.

8. A semiconductor, non-volatile memory device comprising:
    a substrate comprising a p-well; and
    an array of memory cells formed in the p-well wherein the p-well is configured to be biased with a negative voltage during an erase verify operation experienced by at least a portion of the array of memory cells while selected bit lines are configured to be biased with an enable voltage and unselected bit lines are configured to be biased with a disable voltage.

9. The memory device of claim 8 wherein the memory array is organized in a NAND architecture.

10. The memory device of claim 8 wherein the p-well is isolated from a remainder of the substrate by an n-well.

11. The memory device of claim 8 wherein the portion of the array of memory cells is a memory block.

12. The memory device of claim 11 wherein all of the memory block is adapted to experience a back bias in response to the negative voltage.

13. The memory device of claim 8 and further including a control circuit that is adapted to control an erase operation of the at least a portion of the array of memory cells such that the control circuit initiates the erase verify operation and the negative voltage.

14. A memory system comprising:
    a processor for controlling the memory system; and
    a non-volatile memory device, coupled to the processor, comprising:
        a substrate comprising a plurality of wells having a conductivity that is different than surrounding conductivity;
        a memory array comprising a plurality of memory blocks, each memory block formed in a different well of the plurality of wells; and
        control circuitry coupled to the memory array, the memory controller configured to control execution of memory block erase and erase verify operation wherein a first well of the plurality of wells is biased with a negative voltage during execution of the erase verify operation on a first memory block formed in the first well and further wherein the control circuitry is configured to control a bias of selected bit lines during the erase verify operation at $V_{CC}$ and unselected bit lines at a disable voltage.

15. The memory system of claim 14 wherein the control circuitry is further adapted to control execution of biasing each word line in the first memory block with an erase verify voltage, during the erase verify operation, while the first well is biased with the negative voltage.

16. The memory system of claim 14 wherein the substrate is a p-type substrate wherein each well is a p-well and is isolated from other wells of the plurality of wells by an n-well surrounding each p-well.

17. The memory system of claim 14 wherein the non-volatile memory device is a NAND flash memory device.

* * * * *